(12) United States Patent
Thibeault et al.

(10) Patent No.: US 7,678,657 B1
(45) Date of Patent: Mar. 16, 2010

(54) SYSTEM AND METHOD FOR MANUFACTURING AN EMITTER STRUCTURE IN A COMPLEMENTARY BIPOLAR CMOS TRANSISTOR MANUFACTURING PROCESS

(75) Inventors: Todd Patrick Thibeault, Gorham, ME (US); Steven J. Adler, Cape Elizabeth, ME (US); Scott David Ruby, Durham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 590 days.

(21) Appl. No.: 11/591,850

(22) Filed: Nov. 2, 2006

(51) Int. Cl.
*H01L 21/44* (2006.01)
(52) U.S. Cl. ........................ 438/343; 438/309
(58) Field of Classification Search ......... 438/202–204, 438/229, 234, 299, 309, 320, 336, 339, 343; 257/525, 565, E27.055, E29.03, 571
See application file for complete search history.

(56) References Cited

U.S. PATENT DOCUMENTS

| 7,439,119 B2 * | 10/2008 | Nanda et al. ............... 438/197 |
| 2005/0101115 A1 * | 5/2005 | Fan et al. ..................... 438/611 |

* cited by examiner

*Primary Examiner*—David Vu
*Assistant Examiner*—Suberr Chi

(57) ABSTRACT

A system and method are disclosed for manufacturing an emitter structure in a complementary bipolar complementary metal oxide semiconductor (CBiCMOS) transistor manufacturing process. A protective layer is formed over an emitter layer in a transistor structure and lateral portions of the protective layer and the emitter layer are etched to form an emitter structure. An oxide layer is then deposited over the transistor structure and an etchback process is performed to remove portions of the oxide layer from the top of the protective layer. A source/drain implant process is then performed to implant an extrinsic base region of the transistor. The protective layer protects the emitter structure from the implant process. Then the protective layer is removed from the emitter structure.

20 Claims, 7 Drawing Sheets

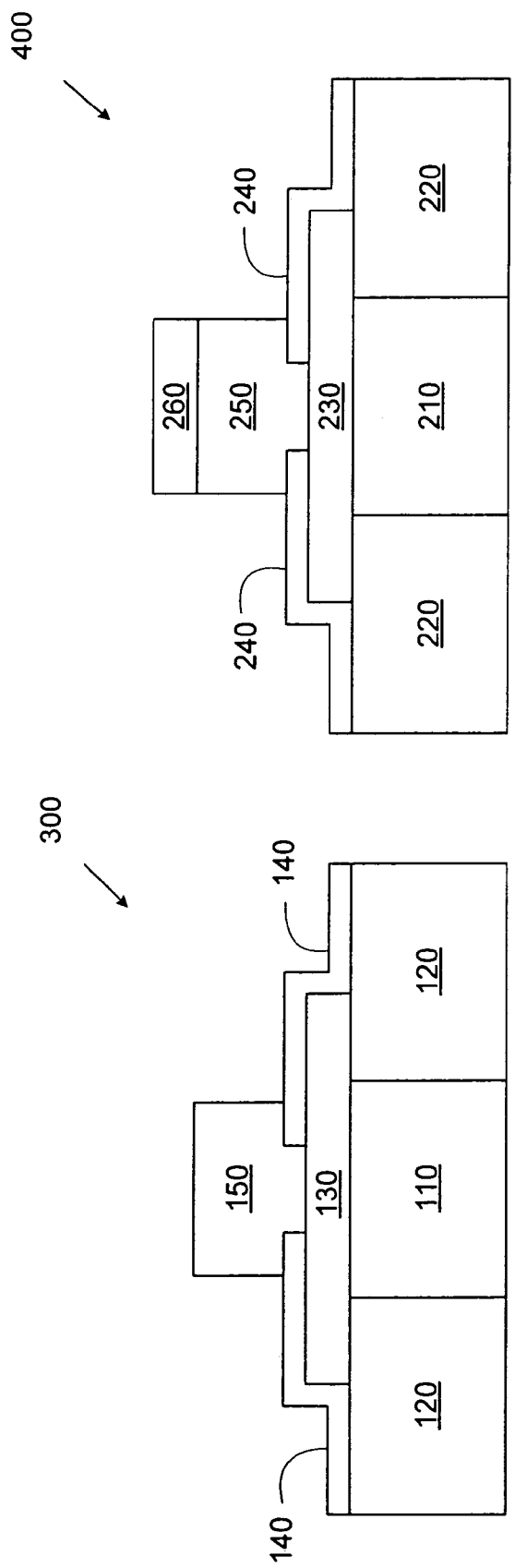

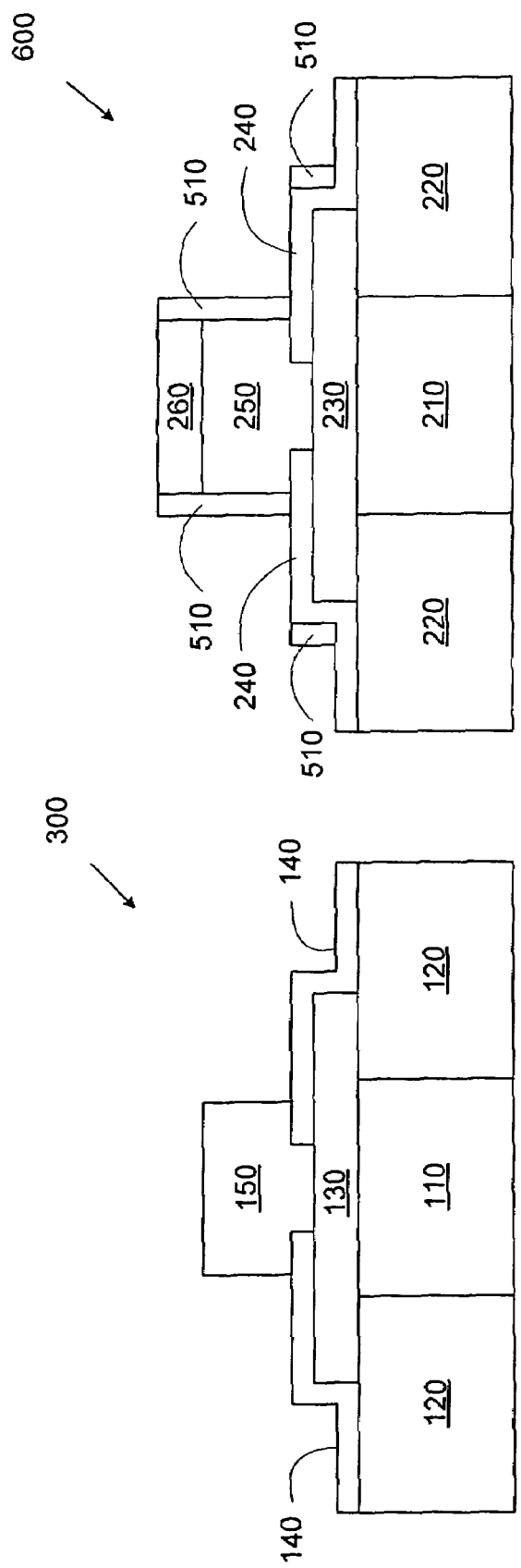

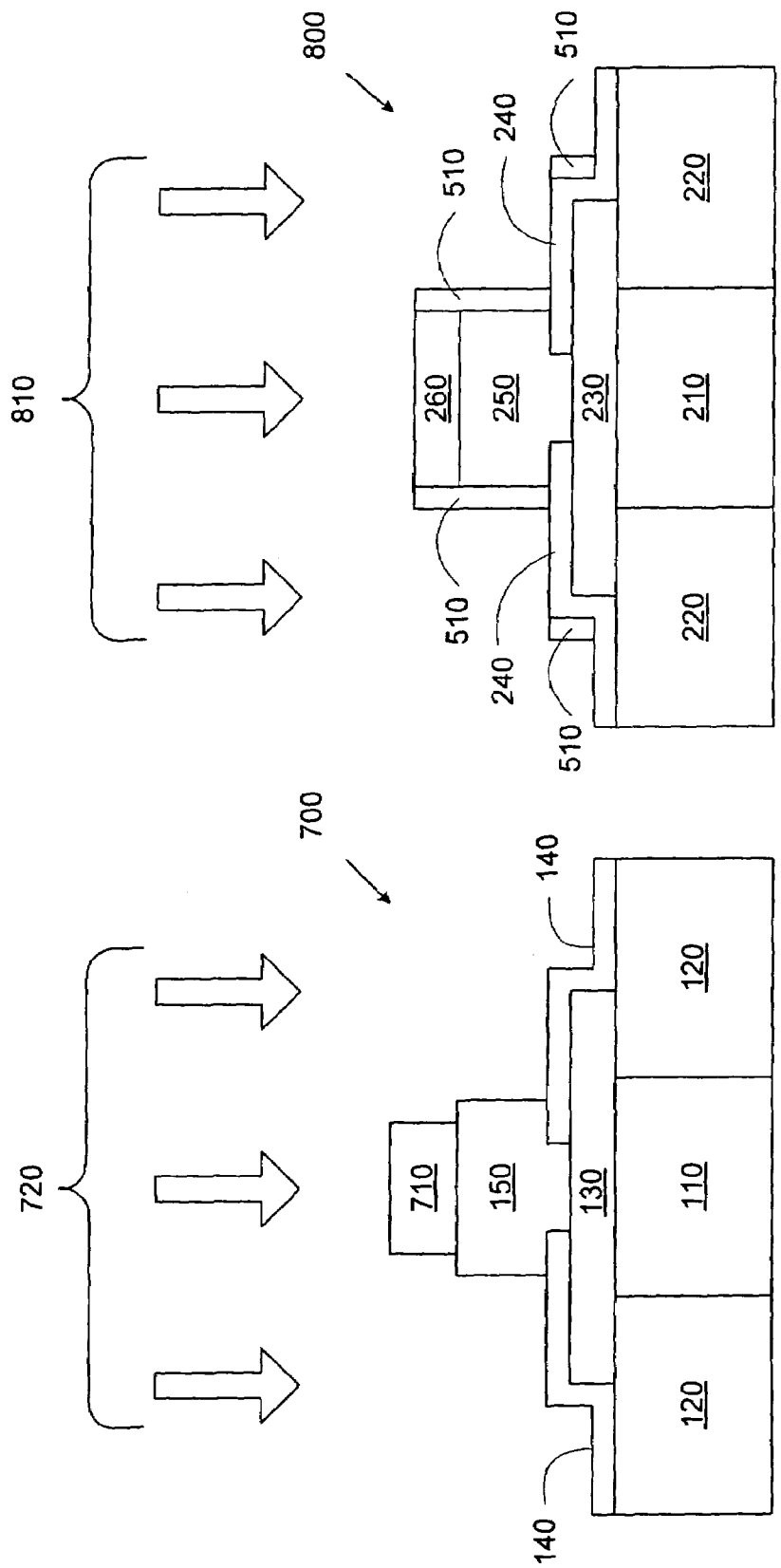

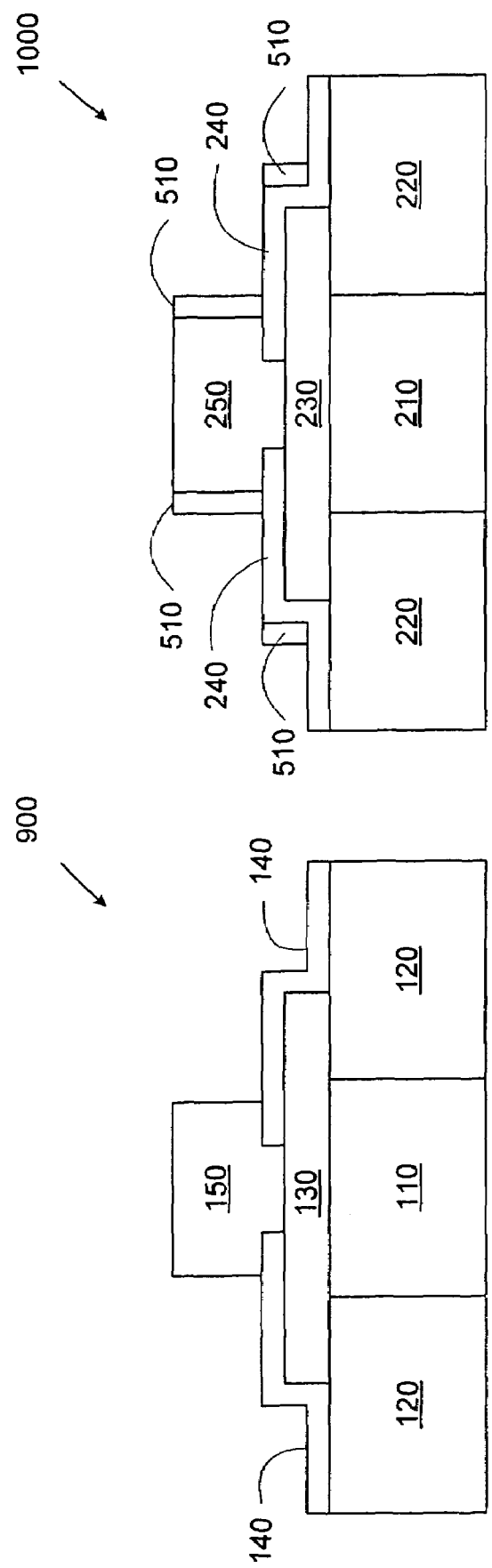

US 7,678,657 B1

SYSTEM AND METHOD FOR MANUFACTURING AN EMITTER STRUCTURE IN A COMPLEMENTARY BIPOLAR CMOS TRANSISTOR MANUFACTURING PROCESS

TECHNICAL FIELD OF THE INVENTION

The present invention is generally directed to the manufacture of integrated circuits and, in particular, to a system and method for manufacturing an emitter structure in a complementary bipolar CMOS transistor manufacturing process.

BACKGROUND OF THE INVENTION

In the manufacture of integrated circuits it is desirable to reduce the number of manufacturing steps. In particular, it is desirable to reduce the number of mask and etch steps that are used in the manufacture of complementary bipolar complementary metal oxide semiconductor (CBiCMOS) transistors. The number of mask and etch steps required for to manufacture a transistor is referred to as the "mask count." Any method for reducing the mask count for a CBiCMOS process flow can reduce manufacturing cost and cycle time. Reducing the mast count, however, requires certain tradeoffs.

One method of reducing the mask count is to combine the extrinsic base implants of the transistor with the source/drain implants of the transistor during the manufacturing process. Because the extrinsic base implants and the source/drain implants are both high dose implants, they can usually share the same implant dose during the manufacturing process. The tradeoff involved in this method is that combining these two implants could result in some counter-doping of the emitter of the transistor if the extrinsic base is self-aligned to the emitter.

Counter-doping can cause an increased resistance in the emitter. An increased resistance in the emitter can adversely affect the direct current (DC) and alternating current (AC) performance of the transistor. Counter-doping can also alter the diffusion in the emitter-base junction. Altering the diffusion in the emitter-base junction of the transistor can also adversely affect the direct current (DC) and alternating current (AC) performance of the transistor.

During the source/drain implant process the emitter can be protected by placing a resist block over it. In order for the emitter to remain self-aligned, however, the resist block must be smaller than the emitter to ensure that the resist block does not extend over the edge of the emitter. An alternative approach is involves counter-doping the emitter with the source/drain implant. This approach has been demonstrated to be feasible but it has certain drawbacks.

Therefore, there is a need in the art for an improved system and method of manufacturing an emitter structure for a transistor. In particular, there is a need in the art for an improved system and method of manufacturing an emitter structure for a complementary bipolar CMOS (CBiCMOS) transistor without increasing the mask count in the manufacturing process.

In an advantageous embodiment of the system and method of the present invention for manufacturing an emitter structure, a protective layer is formed over an emitter layer in a transistor structure and lateral portions of the protective layer and the emitter layer are etched to form an emitter structure. An oxide layer is then deposited over the transistor structure and an etchback process is performed to remove portions of the oxide layer from the top of the protective layer. A source/drain implant process is then performed to implant an extrinsic base region of the transistor. The protective layer protects the emitter structure from the effects of the implant process. Then the protective layer is removed from the emitter structure.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIGS. 3A through 3C each illustrate a cross sectional view of the prior art integrated circuit structure shown in FIG. 1 after a mask and etch process has been performed to etch away lateral portions of the N type emitter polysilicon layer;

FIG. 4 illustrates a cross sectional view of the integrated circuit structure of the present invention shown in FIG. 2 after a mask and etch process has been performed to etch away lateral portions of the nitride layer and lateral portions of the N type emitter polysilicon layer;

FIG. 6 illustrates a cross sectional view of the integrated circuit structure of the present invention shown in FIG. 5 after an etchback process has been performed to etch away portions of the oxide layer from the nitride layer over the emitter structure;

FIG. 7 illustrates a cross sectional view that shows a P+ implant process applied to the prior art integrated circuit structure shown in FIG. 3 after a resist block has been placed on top of the emitter structure;

FIG. 8 illustrates a cross sectional view that shows a P+ implant process applied to the integrated circuit structure of the present invention shown in FIG. 6;

FIG. 9 illustrates a cross sectional view that shows the prior art integrated circuit structure shown in FIG. 7 after the resist block has been removed;

FIG. 10 illustrates a cross sectional view of the integrated circuit structure of the present invention shown in FIG. 8 after a process has been performed to etch away the nitride layer from the top of the emitter structure.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit structure.

The system and method of the present invention will be described with reference to an exemplary NPN transistor structure. It is understood that the NPN transistor structure is only one example and that the present invention is not limited to an NPN transistor structure. It is understood that those who are skilled in the art may apply the system and method of the present invention to a PNP transistor structure, or to other similar types of integrated circuit structures.

Figure 1:
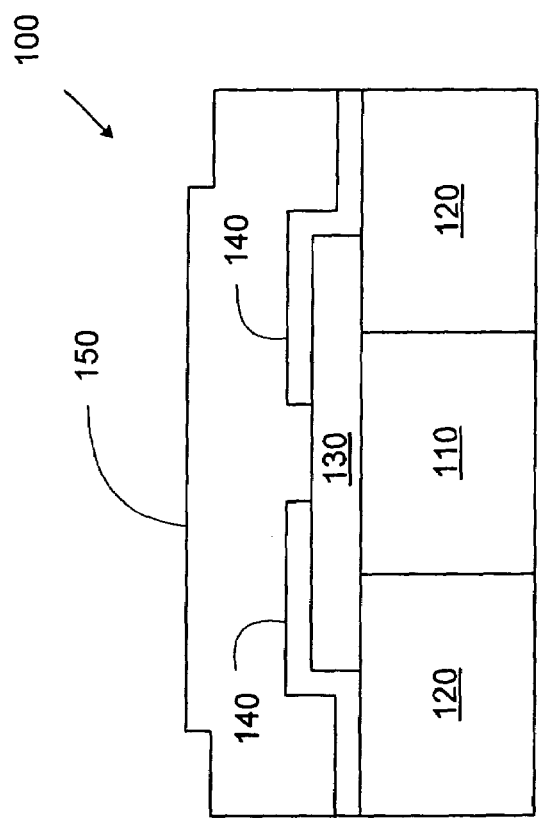
FIG. 1 illustrates a cross sectional view of a prior art integrated circuit structure for manufacturing an NPN transistor that comprises an N type collector, a P type base, a nitride/oxide stack, and an N type emitter polysilicon layer.

FIG. 1 illustrates a cross sectional view of a prior art integrated circuit structure 100 for manufacturing an NPN transistor. Structure 100 comprises an N type collector 110 between two shallow trench isolation structures 120. A P type base layer 130 is placed over the N type collector 110 and over portions of the shallow trench isolation structures 120. As shown in FIG. 1, a first portion of a nitride/oxide stack layer 140 is placed over a first end of the P type base layer 130 and a second portion of the nitride stack layer 140 is placed over a second end of the P type base layer 140. An N type emitter polysilicon layer 150 is placed over the nitride/oxide stack layer 140 and the exposed portions of the P type base layer 130.

Figure 2:
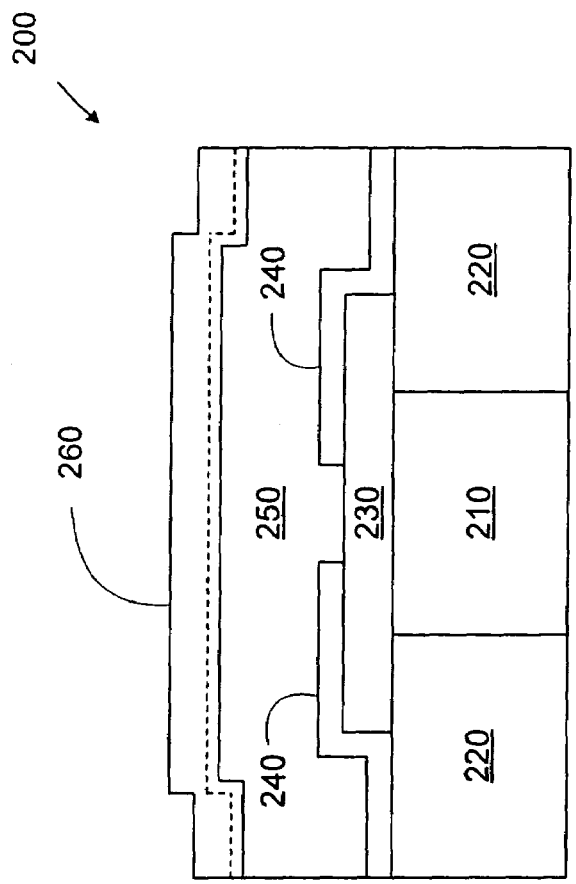
FIG. 2 illustrates a cross sectional view of an integrated circuit structure of the present invention for manufacturing an NPN transistor that comprises an N type collector, a P type base, a nitride/oxide stack, an N type emitter polysilicon layer, and a nitride layer over the N type emitter polysilicon layer.

FIG. 2 illustrates an integrated circuit structure 200 of the present invention for manufacturing an NPN transistor. Structure 200 comprises an N type collector 210 between two shallow trench isolation structures 220. A P type base layer 230 is placed over the N type collector 210 and over portions of the shallow trench isolation structures 220. As shown in FIG. 2, a first portion of a nitride/oxide stack layer 240 is placed over a first end of the P type base layer 230 and a second portion of the nitride stack layer 240 is placed over a second end of the P type base layer 240. An N type emitter polysilicon layer 250 is placed over the nitride/oxide stack layer 240 and the exposed portions of the P type base layer 230. To this point structure 200 of the present invention is identical to the prior art structure 100.

The structure 200 of the present invention differs from the prior art structure 100 in that the N type emitter polysilicon layer 250 is covered with a protective layer 260. In one advantageous embodiment, the protective layer 260 comprises a silicon nitride layer 260. In one advantageous embodiment of the invention, the thickness of the nitride layer 260 is approximately one thousand Ångstroms (1000 Å). An Ångstrom is equal to $10^{-10}$ meter. As will be further described, the purpose of the nitride layer 260 is to protect the emitter structure from the effects of a subsequent implant process.

In another advantageous embodiment of the invention, the layer that placed on top of the N type emitter polysilicon layer 250 may comprise two layers. The first layer (shown in dotted outline in FIG. 1) that is placed on top of the N type emitter polysilicon layer 250 is a silicon oxide layer. In one advantageous embodiment the silicon oxide layer is approximately one hundred fifty Ångstroms thick. The second layer that is placed on the silicon oxide layer is the nitride layer 260. In one advantageous embodiment the nitride layer 260 is approximately one thousand Ångstroms thick. Although the following description will refer only to the nitride layer 260, it is understood that a silicon oxide layer of the type described above may optionally be placed between the nitride layer 260 and the N type emitter polysilicon layer 250.

In the next processing step of the prior art method a mask and etch process is performed on the structure 100 to etch away lateral portions of the N type emitter polysilicon layer 150. A cross sectional view of the resulting structure 300 is shown in FIG. 3A. The remaining central portions of the N type emitter polysilicon layer 150 form the emitter structure for the NPN transistor.

In the next processing step of the method of the invention a mask and etch process is performed on the structure 200. The mask and etch process etches away lateral portions of the nitride layer 260 and lateral portions of the N type emitter polysilicon layer 250. A cross sectional view of the resulting structure 400 is shown in FIG. 4. The remaining central portions of the N type emitter polysilicon layer 250 under the nitride layer 260 form the emitter structure for the NPN transistor.

Figure 5:
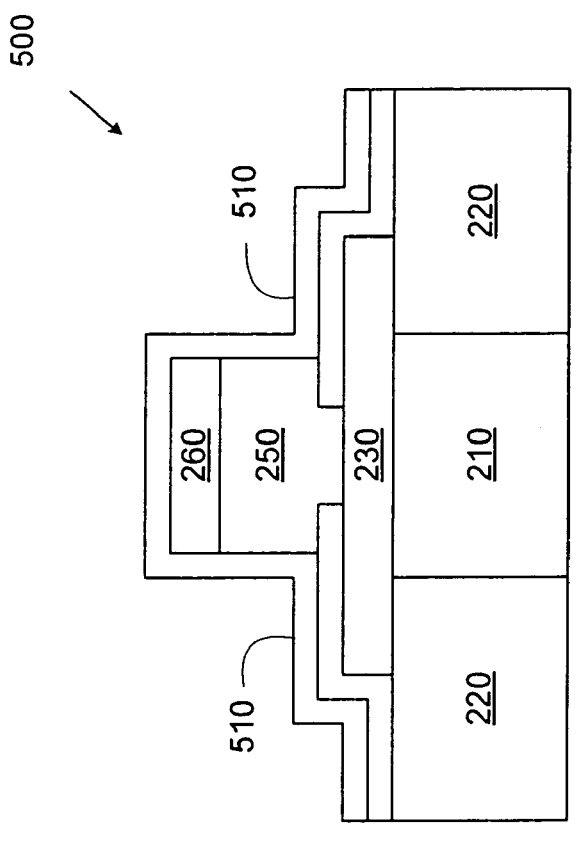
FIG. 5 illustrates a cross sectional view of the integrated circuit structure of the present invention shown in FIG. 4 after an oxide layer has been deposited over the structure.
Figure 3B:
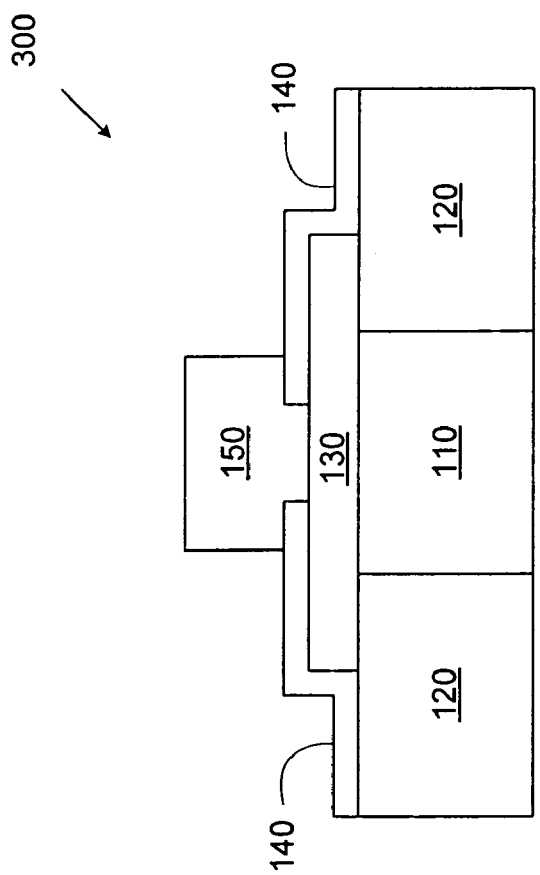

In the next processing step of the method of the invention an oxide layer 510 is deposited over the structure 400. FIG. 5 illustrates a cross sectional view of the integrated circuit structure 500 of the present invention after the oxide layer 510 has been deposited over the structure. There is no corresponding step in the prior art method and the prior art structure 300 (shown again for reference purposes in FIG. 3B) remains unchanged.

In the next processing step of the method of the invention an etchback process is performed to etch away portions of the oxide layer 510 from the top of the nitride layer 260 over the emitter structure 250. The etchback process also etches away portions of the oxide layer 510 from the horizontal portions of the nitride/oxide stack layer 240. FIG. 6 illustrates a cross sectional view of the integrated circuit structure 600 of the present invention after the etchback process has been performed. There is no corresponding step in the prior art method and the prior art structure 300 (shown again for reference purposes in FIG. 3C) remains unchanged.

In the next processing step of the prior art method the extrinsic base of the NPN transistor is implanted with a P+ source/drain implant process. An optional resist block 710 may be placed over the N type emitter polysilicon layer 150. FIG. 7 illustrates a cross sectional view that shows the P+ source/drain implant process applied to the prior art integrated circuit structure 700. The P+ source/drain implant process is represented in FIG. 7 by three parallel arrows 720.

In the prior art method either (1) there is no resist block 710 in place and the N type emitter polysilicon layer 150 is implanted with the P+ source/drain implant process 720, or (2) there is a resist block 710 in place and the N type emitter polysilicon layer 150 is protected from at least some of the effects of the P+ source/drain implant process 720.

If the resist block 720 is undersized with respect to the lateral dimensions of the N type emitter polysilicon layer 150, then the exposed portions of the N type emitter polysilicon layer 150 receives some the P+ source/drain implant. If the resist block 720 is oversized with respect to the lateral dimensions of the N type emitter polysilicon layer 150, then the extrinsic base will not be self aligned.

In the next processing step of the method of the invention the extrinsic base of the NPN transistor is implanted with a P+ source/drain implant process. FIG. 8 illustrates a cross sectional view that shows the P+ source/drain implant process applied to the integrated circuit structure 800 of the invention. The P+ source/drain implant process is represented in FIG. 8 by three parallel arrows 810. The nitride layer 260 that is located over the emitter structure 250 acts as a screen that protects the emitter structure 250 from the P+ source/drain implant process 810. The nitride layer 260 must be thick enough to block the P+ source/drain implant process 810 from reaching the emitter structure 250.

In the next processing step of the method of the invention the nitride layer 260 is removed from the NPN structure 800. FIG. 10 illustrates a cross sectional view of the integrated circuit structure of the present invention 1000 after an etch process been performed to etch away the nitride layer 260 from the top of the emitter structure 250. The nitride layer 260 can be etched away by a dry etch. An isotropic dry etch is a preferred method for eliminating residual spacers on MOS structures.

Alternatively, the nitride layer 260 can be etched away with a phosphoric strip process. If a phosphoric strip process is used, then the nitride/oxide stack 240 is preferred. In this situation, the vertical portions of the oxide layer 510 on the sides of the N type emitter polysilicon layer 250 must be thick enough to withstand the deglaze process in order to prevent phosphoric attack of the emitter polysilicon layer 250 by the phosphoric strip process. Subject to this thickness requirement, the vertical portions of the oxide layer 510 should be as thin as possible.

There is no corresponding step in the prior art method. The prior art structure 700 (shown again for reference purposes as structure 900 in FIG. 9) remains unchanged (except for the removal of optional resist block 710).

The method of the invention is particularly useful in a complementary bipolar CMOS manufacturing process. The method of the invention may be advantageously employed during the manufacture of NPN transistors and PNP transistors in a complementary bipolar CMOS manufacturing process. The ability of the method of the invention to combine the extrinsic base implant with the source/drain implant eliminates at least one mask step in the transistor manufacturing process. The method of the invention may also eliminate two mask steps in some transistor manufacturing processes.

Figure 11:
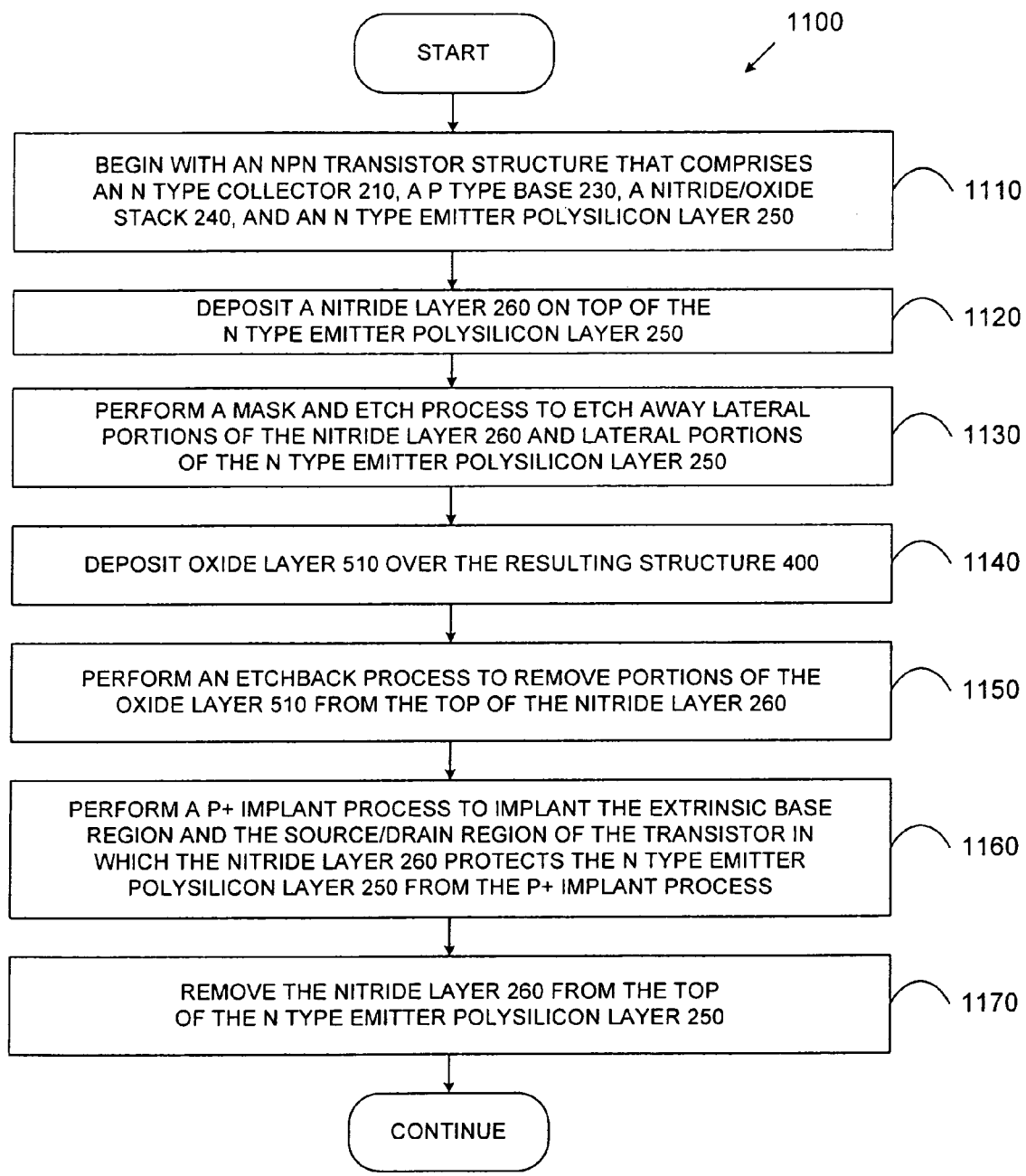
FIG. 11 illustrates a flow chart showing the steps of an advantageous embodiment of the method of the present invention.

FIG. 11 illustrates a flow chart 1100 showing the steps of an advantageous embodiment of the method of the present invention. In the first step of the method an NPN transistor structure is provided that comprises an N type collector 210 between two shallow trench isolation structures 220, a P type base layer 230, a nitride/oxide stack layer 240 and an N type emitter polysilicon layer 250 (step 1110). Then a nitride layer 260 is deposited on top of the N type emitter polysilicon layer 250 (step 1120).

Then a mask and etch process is performed to etch away lateral portions of the nitride layer 260 and lateral portions of the N type emitter polysilicon layer 250 (step 1130). Then an oxide layer 510 is deposited over the resulting structure 400 (step 1140). Then an etchback process is performed to remove portions of the oxide layer 510 from the top of the nitride layer 260 (step 1150).

Then a P+ implant process is performed to implant the extrinsic base region and the source/drain region of the transistor in which the nitride layer 260 protects the N type emitter polysilicon layer 250 from the implant process (step 160). The nitride layer 260 is removed from the N type emitter polysilicon layer 250 (step 1170).

The exemplary transistor described above is an NPN transistor. It is understood that the NPN transistor structure is only one example and that the present invention is not limited to an NPN transistor structure. It is understood that those who are skilled in the art may apply the system and method of the present invention to a PNP transistor structure. In particular, in a PNP transistor structure, the N type collector 210 of the NPN transistor is replaced with a P type collector, the P type base layer 230 is replaced with an N type base layer, and the N type emitter polysilicon layer 250 is replaced with a P type emitter polysilicon layer. The structure and operation of the nitride/oxide stack layer 240 and the silicon nitride layer 260 are unchanged.

When a semiconductor material is said to have a first polarity type, then the opposite type polarity is said to be a second polarity type. For example, when a semiconductor material has an N type polarity, then the first polarity type is an N type and the opposite P type polarity is the second polarity type. When an semiconductor material has a P type polarity, then the first polarity type is a P type and the opposite N type polarity is the second polarity type.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing in a transistor integrated circuit, said method comprising the steps of:
    forming a transistor structure that comprises a collector of a first polarity type, a base of a second polarity type, and an emitter layer of said first polarity type;
    forming a protective layer over said emitter layer, the protective layer comprising a first oxide layer over the emitter layer and a nitride layer over the first oxide layer;
    etching portions of said protective layer and portions of said emitter layer to form an emitter structure;
    depositing a second oxide layer over said emitter structure;
    performing an etchback process to etch away portions of said second oxide layer from a top surface of said protective layer, the etchback process leaving vertical portions of the second oxide layer on vertical sides of the emitter structure.

2. The method as claimed in claim 1 wherein said first polarity type is an N type polarity and said second polarity type is a P type polarity.

3. The method as claimed in claim 1 wherein said first polarity type is a P type polarity and said second polarity type is an N type polarity.

4. The method as claimed in claim 1, wherein said nitride layer is approximately one thousand Angstroms in thickness.

5. The method as claimed in claim 1, wherein said first oxide layer is approximately one hundred fifty Angstroms in thickness.

6. The method as claimed in claim 1, wherein the collector is disposed between two shallow trench isolation structures.

7. The method as claimed in claim 1 further comprising the steps of:
    exposing an extrinsic base of said transistor structure to a source/drain implant process of said second polarity type;
    preventing said source/drain implant process from reaching said emitter structure using said protective layer; and
    removing said protective layer from said emitter structure.

8. The method as claimed in claim 7 wherein said first polarity type is an N type polarity and said second polarity type is a P type polarity.

9. The method as claimed in claim 7 wherein said first polarity type is a P type polarity and said second polarity type is an N type polarity.

10. The method as claimed in claim 7 wherein said protective layer is removed using a phosphoric strip process, and wherein the vertical portions of the second oxide layer prevent attack of the emitter layer by the phosphoric strip process.

11. The method as claimed in claim 1 wherein said first oxide layer comprises a silicon oxide layer.

12. A method for eliminating at least one mask step in a complementary bipolar complementary metal oxide semiconductor transistor manufacturing process, said method comprising the steps of:
    forming a transistor structure that comprises a collector of a first polarity type, a base of a second polarity type, and an emitter layer of said first polarity type;
    forming a protective layer over said emitter layer, the protective layer comprising a silicon oxide layer over the emitter layer and a silicon nitride layer over the silicon oxide layer;
    etching portions of said protective layer and portions of said emitter layer to form an emitter structure;
    depositing an oxide layer over said transistor structure; and
    performing an etchback process to etch away portions of said oxide layer from a top surface of said protective layer, the etchback process leaving vertical portions of the oxide layer on vertical sides of the emitter structure.

13. The method as claimed in claim 12, wherein the collector is disposed between two shallow trench isolation structures.

14. The method as claimed in claim 12 further comprising the steps of:
    exposing an extrinsic base of said transistor structure to a source/drain implant process of said second polarity type;
    preventing said source/drain implant process from reaching said emitter structure using said protective layer; and
    removing said protective layer from said emitter structure.

15. The method as claimed in claim 14 wherein said first polarity type is an N type polarity and said second polarity type is a P type polarity.

16. The method as claimed in claim 14 wherein said first polarity type is a P type polarity and said second polarity type is an N type polarity.

17. The method as claimed in clam 14 wherein said silicon nitride layer is approximately one thousand Angstroms in thickness.

18. A method of manufacturing a transistor in a complementary bipolar complementary metal oxide semiconductor transistor manufacturing process, said method comprising the steps of:
    forming a transistor structure that comprises a collector of a first polarity type, a base of a second polarity type, and an emitter layer of said first polarity type;
    forming a protective layer over said emitter layer, the protective layer comprising a first oxide layer over the emitter layer and a nitride layer over the first oxide layer;
    etching portions of said protective layer and portions of said emitter layer to form an emitter structure;
    depositing an oxide layer over said emitter structure;
    performing an etchback process to etch away portions of said oxide layer from a top surface of said protective layer,
    exposing an extrinsic base of said transistor structure to a source/drain implant process of said second polarity type;
    preventing said source/drain implant process from reaching said emitter structure using said protective layer; and
    removing said protective layer from said emitter structure.

19. The method as claimed in claim 18 wherein said first polarity type is an N type polarity and said second polarity type is a P type polarity.

20. The method as claimed in claim 18 wherein said first polarity type is a P type polarity and said second polarity type is an N type polarity.

* * * * *